United States Patent [19]

Kellerman et al.

[11] Patent Number: 5,158,912

[45] Date of Patent: Oct. 27, 1992

[54] INTEGRAL HEATSINK SEMICONDUCTOR PACKAGE

[75] Inventors: Dave Kellerman, Littleton; Robert J. Hannemann, Wellesley; Stanley J. Czerepak, Burlington; Robert J. Simcoe, Westborough, all of Mass.

[73] Assignee: Digital Equipment Corporation, Maynard, Mass.

[21] Appl. No.: 682,771

[22] Filed: Apr. 9, 1991

[51] Int. Cl.⁵ .................. H01L 21/60; H01L 23/02; H02B 1/00

[52] U.S. Cl. .................................. 437/218; 437/197; 437/203; 437/209; 437/902; 357/80; 357/81; 361/385

[58] Field of Search ............ 357/81, 80; 437/197, 437/203, 209, 218, 902; 361/385

[56] References Cited

U.S. PATENT DOCUMENTS

| | | |
|---|---|---|
| 4,435,480 | 3/1984 | Mizuhara . |
| 4,624,896 | 11/1986 | Watanabe et al. . |
| 4,645,552 | 2/1987 | Vitriol et al. . |
| 4,659,611 | 4/1987 | Iwase et al. . |
| 4,695,517 | 9/1987 | Okuno et al. . |
| 4,712,609 | 12/1987 | Iverson . |
| 4,724,283 | 2/1988 | Shimada et al. . |
| 4,770,953 | 9/1988 | Horiguchi et al. . |
| 4,804,823 | 2/1989 | Okuda et al. . |
| 4,839,717 | 6/1989 | Phy et al. ........................... 357/74 |
| 4,987,478 | 1/1991 | Braun et al. ........................ 357/81 |

Primary Examiner—Edward J. Wojciechowicz
Attorney, Agent, or Firm—Denis G. Maloney; Ronald E. Myrick; Barry N. Young

[57] ABSTRACT

An injection molded aluminum nitride heatsink forms the substrate of an integral heatsink semiconductor package in which a semiconductor chip is attached directly to the integrated heatsink forming an intimate thermal relationship between the heat generating source and the heat dissipating means. In a first embodiment, a planar surface of the heatsink component provides the substrate for the attachment of a semiconductor chip and a multilayer housing formed from a plurality of layers of dielectric glass ceramic lamina and conductive circuit layers. The multilayer housing is formed on top of the heatsink substrate creating a recessed cavity in which the semiconductor die sits and is attached directly to the heatsink. The semiconductor chip is attached to the circuit layers of the housing through any of the known electrical connection methods, such as wirebonding or tab tape. A cover plate is mounted over the cavity. In a second embodiment a recessed cavity with a planar surface is formed directly in the heatsink and the semiconductor chip is mounted directly to the surface within the cavity. A plurality of tab leads are connected to the semiconductor and a cover plate is mounted over the cavity sealing the semiconductor and its electrical connections inside.

6 Claims, 8 Drawing Sheets

INTEGRAL HEATSINK SEMICONDUCTOR PACKAGE

BACKGROUND OF THE INVENTION

1. Field of the Invention

This invention relates to semiconductor chip packaging technology and specifically to the integration of a heatsink element directly into the body of a semiconductor chip package.

2. Related Art

Packaging is one of the final steps in the process of manufacturing semiconductor chips. In packaging, a fabricated semiconductor chip is mounted within a protective housing. At the present moment, the art of semiconductor chip technology has evolved far more quickly than the integrally related technology of packaging the semiconductor chips. The packaging requirements of the newer, smaller, more powerful semiconductor chips are quickly progressing beyond the capabilities of traditional packaging technology and the conventional materials and designs presently utilized are quickly becoming obsolete. The packaging of new semiconductors needs new configurations to accommodate increasing numbers of electrical interconnections, constraints due to decreasing size, and, most importantly, exponentially growing heat transfer needs. The need to adequately transfer heat out of increasingly smaller semiconductor packages has spawned significant interest in the development of new packaging materials and more thermally efficient configurations.

Currently, semiconductor packaging utilizes the art of attaching an external heatsink to improve the heat transfer characteristics of many chip packages which do not adequately transfer heat away from the semiconductor chip. However, with the increasing heat transfer needs of new semiconductor chips the addition of an external heatsink is no longer thermally efficient.

In heat transfer technology, the two most significant modes of heat transfer are heat conduction and heat convection. Heat conduction is the transfer of heat either, through a single solid medium, or from one solid medium to another adjacent solid medium. The transfer of heat through the medium or between mediums is based on a temperature differential, i.e. heat flowing from hot to cold, until an equilibrium is reached. Heat convection is the transfer of heat away from a hot, solid medium to a cooler ambient body of air which has a generally constant temperature. The heat is convected away by warm air currents created by the warming of the air in close proximity to the hot, solid medium. Both of these heat transfer modes are paramount in evaluating the heat transfer characteristics of semiconductor packages.

The heat dissipating characteristics of semiconductor packages are measured by a network of heat transfer pathways through which heat must flow. The heat must be conducted from the chip through various thermal pathways to reach an outer surface of the package exposed to an ambient air body and then be convected away to that ambient air body.

Every packaging material has its own unique thermal characteristics. One of these characteristics is known as thermal conductivity. The thermal conductivity of a material determines the amount of heat that can be conducted through and away from that material. Some materials have high thermal conductivity, such as metals, and other materials have low thermal conductivity, such as rubber or glass. Materials having low thermal conductivity are known as thermal insulators. The most common semiconductor packaging materials, such as glass and glass ceramic composites, which allow for ease of manufacturing, have low thermal conductivities which hinder the dissipation of heat.

Depending on the construction of the semiconductor package, a package may have only a few materials or may have a multitude of various materials of varying thermal conductivity through which heat must be conducted to reach the ambient air. Because thermal conductivities are coupled together where materials meet, similar to electrical resistances, the more materials present between the source of heat generation and the ambient air mass, the more restricted the heat conduction will be.

Once heat from the semiconductor chip has been conducted through the various materials of the package and reaches the surface of the package it must be convected away to an ambient air mass. This process involves another thermal pathway.

As noted previously, heat transfer from the external surfaces of semiconductor packages is normally handled by the external addition of specially configured heatsinks which are mounted over the areas of greatest heat generation. This allows the heat to be conducted from the surface of the package, which usually has a low thermal conductivity, into the heatsink, which preferably has a high thermal conductivity and a large surface area, and then be convected away to the ambient air mass. The shape of the heatsinks are configured to allow for a large surface area which increases heat convection away from the package. In previous applications, where the heat generation of semiconductor chips was moderate the addition of an external heatsink worked well. The additional heat transfer capability created by externally bonding the heatsink to the package was sufficient to transfer any heat generated by the chip.

However, as heat generation has increased exponentially in the newer, smaller semiconductors, the effectiveness of externally mounted heatsinks has decreased. The thermal pathways of the package and heatsink can no longer adequately transfer the heat generated and can subsequently cause malfunctions within the semiconductors.

A major heat transfer problem common to many semiconductor packages is the configuration of the package and the mounting location of the semiconductor chip. Advantageously locating the chip can eliminate several thermal boundaries and increase heat transfer. Because the chip is routinely attached to an internal substrate, usually ceramic alumina, the heat generated from the chip must pass through that substrate before it reaches the heatsink mounted on the outer surface of the package. The substrate, along with the bonding material used to attach the external heatsink, add thermal barriers to the package and limit the maximum heat transfer capability of the package.

Accordingly, the purpose of the present invention is to overcome the packaging problems associated with the transfer of heat out of semiconductor packages.

SUMMARY OF THE INVENTION

The invention provides a semiconductor package in which the heatsink becomes an integral part of the semiconductor package and provides for an intimate thermal relationship between the semiconductor chip and the integral heatsink.

In this invention an injection molded aluminum nitride heatsink forms the substrate of a semiconductor package in which a semiconductor chip is attached directly to the integrated heatsink forming the necessary intimate thermal contact between the heat generating source and the heat dissipating means that is crucial to improving thermal performance.

In a first embodiment the heatsink component is a generally rigid ceramic structure which has a substantially flat first planar surface and a second opposing surface having heat dissipating means thereon such as fins, posts or the like. A multilayer housing, having a central tiered aperture is formed on top of the first surface of the heatsink creating a tiered cavity in which the semiconductor chip sits. The semiconductor chip is attached directly to the first surface of the aluminum nitride heatsink. Attachment of the chip directly to the heatsink provides an intimate thermal relationship between the heat source and the heat dissipation means and creates improved heat transfer capabilities. The housing surrounding the semiconductor chip is formed from a plurality of electrically conductive circuit layers patterned to form a plurality of signal transmission lines and a plurality of and dielectric glass ceramic lamina. The lamina provide insulation for the circuit layers of the package. In order to obtain good bonding between the glass ceramic lamina and the aluminum nitride, the lamina must have a coefficient of thermal expansion similar to that of aluminum nitride. Alternatively, to obtain good bonding, the lamina must be formed from a homogeneous mixture of glass and aluminum nitride particles. The tiers of the cavity provide a base for the attachment of an electrical connection means from the semiconductor chip to exposed ends of the signal transmission lines, as well as, a shelf to attach a cover over the cavity in which the chip is situated.

In a second embodiment the heatsink component is a generally rigid ceramic structure which has a substantially flat first planar surface. The first surface of the heatsink has a recessed cavity formed therein in which a semiconductor chip sits and is attached directly to the heatsink. Attachment directly to the heat sink provides an intimate thermal relationship between the heat source and the heat dissipation means and creates superior heat transfer capabilities. The semiconductor chip has attached to it a section of tape automated bonding tape which has a plurality of conductive leads which extend outwardly providing electrical connections from the chip to a printed wiring board. A cover plate is then attached over the cavity of the heatsink and sealed, leaving only the tape leads exposed outside the package.

Other features and advantages of the invention will become apparent from a reading of the specification when taken in conjunction with the drawings, in which like reference numbers refer to like elements in several views.

BRIEF DESCRIPTION OF THE DRAWING FIGURES

DESCRIPTION OF THE PREFERRED EMBODIMENT

Figure 1:
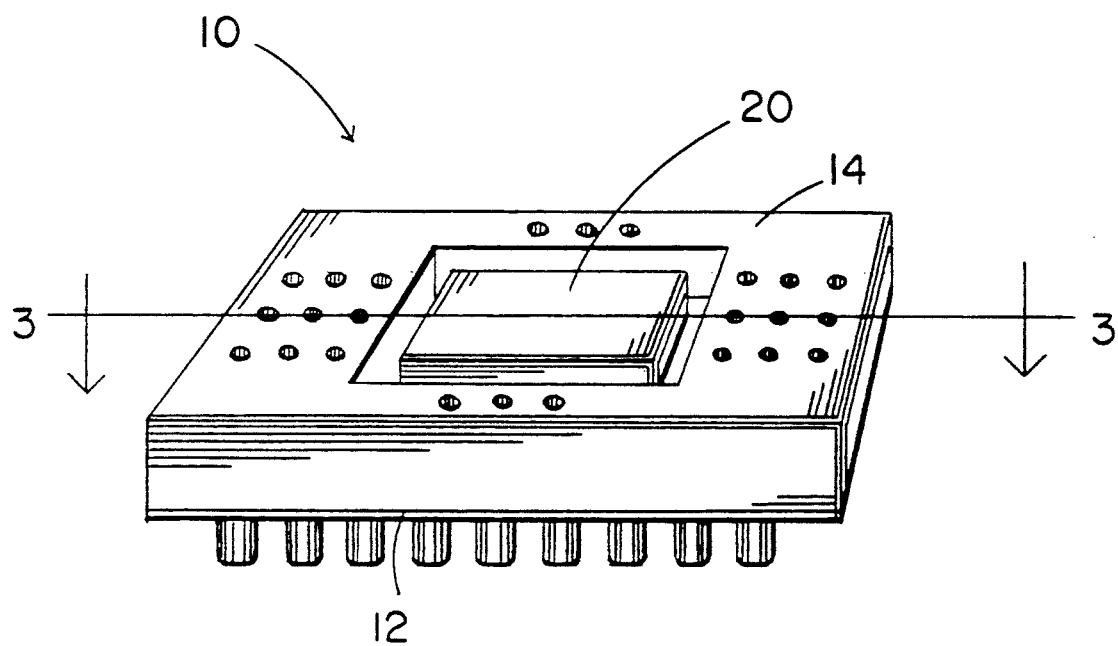
FIG. 1 is an inverted, isometric view showing an integral heatsink semiconductor package in accordance with the invention.

Referring now to the drawings and particularly to FIG. 1 there is shown an integral heatsink semiconductor package 10, the package 10 having an injection molded, aluminum nitride heatsink 12, a multilayer housing structure 14, a semiconductor chip 16 (shown in FIG. 2), wirebonding 18 (also shown in FIG. 2) and a cover plate 20.

In recent efforts to find and develop better materials for semiconductor packaging, one ceramic material that has received attention because of its superior heat dissipating characteristics is aluminum nitride (AlN). AlN is a rigid, dielectric, ceramic material capable of being injection molded into many forms. Injection molding allows versatility in the formation of many packaging elements, especially the heat dissipating elements of heatsink structures such as fins, posts or the like. AlN also has superior mechanical strength compared to other ceramic materials. AlN also has a high thermal conductivity compared to conventional packaging materials. AlN's thermal conductivity is in the range of 150-230 W/mk in comparison to approximately 20 W/mk for alumina which is a widely used material in semiconductor packaging. AlN also has a coefficient of thermal expansion (4.5 ppm/°C.) that is compatible with silicon (3.0 ppm/°C.). Compatible coefficients of thermal expansion are necessary to allow the attachment of large silicon chips to aluminum nitride substrates without the silicon materials becoming detached when heated.

A noted limitation of aluminum nitride is that it has poor wetability characteristics to metal and glass. This characteristic of poor wetability has made it difficult to integrate into packages. Recently however, several processes utilizing glass ceramic lamina with similar TCE's to aluminum nitride have been developed which enable glass ceramic lamina or tape to be bonded to AlN and allow AlN integration into chip packaging. Other processes have also been developed which utilize glass ceramics tapes having certain percentages of aluminum nitride particles mixed with glass.

Figure 2:
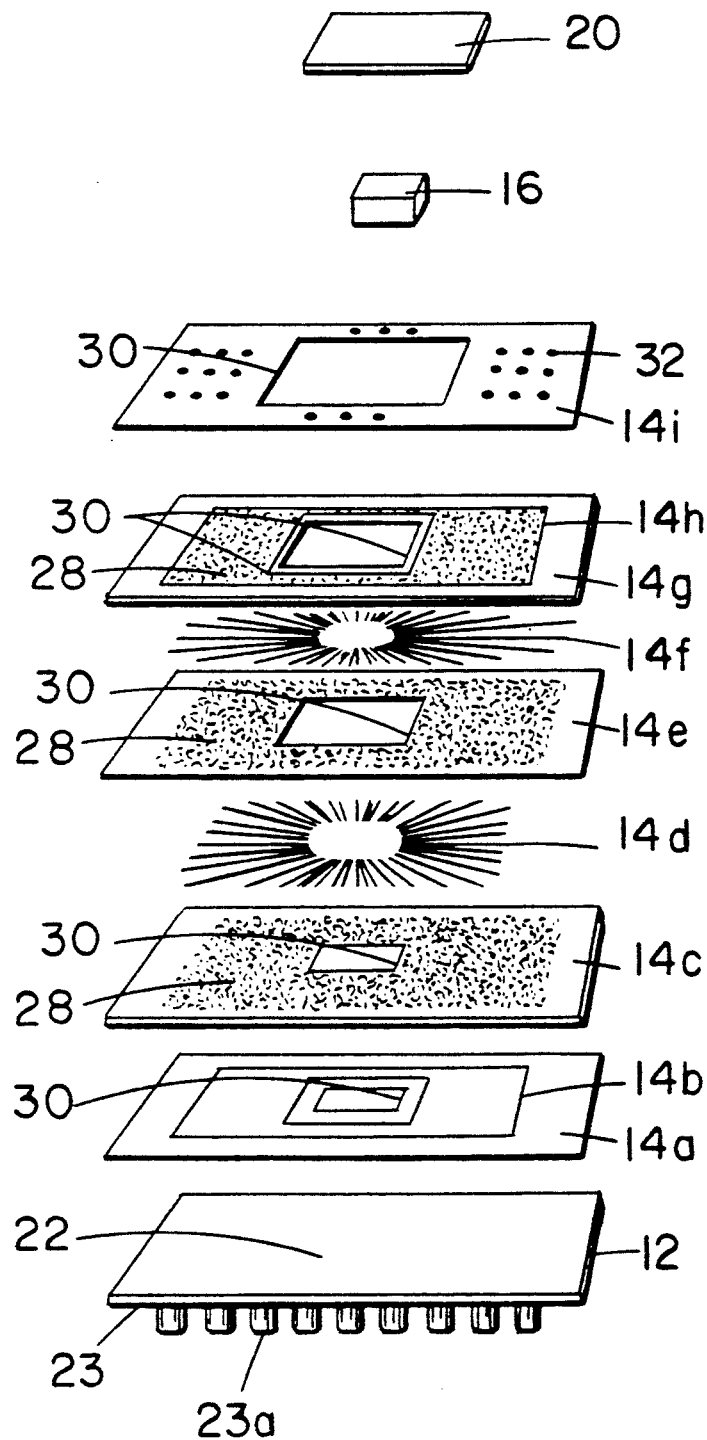
FIG. 2 is an inverted, exploded isometric view showing the individual layers or lamina of the structure of the integral heatsink semiconductor package in accordance with the invention.
Figure 3:
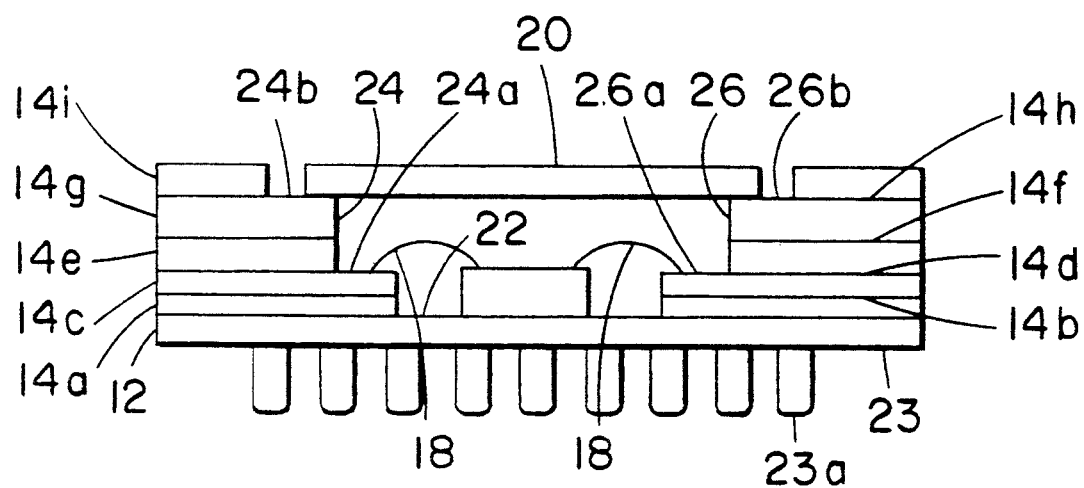
FIG. 3 is an inverted, cross sectional view cut along line 3—3 of FIG. 1 showing the internal configuration of the individual components and the layered structure of the integral heatsink semiconductor package in accordance with the invention.

Referring now to FIGS. 2 and 3 the AlN heatsink 12 is a generally rigid ceramic structure having a substantially flat first planar surface 22 and a second opposing surface 23 having heat dissipating means thereon 23a. The first surface 22 provides a substantially flat substrate for the attachment of a semiconductor chip 16 and construction of a housing 14.

The housing 14 is a generally rigid, multilayer structure having a tiered aperture means 24 formed therein. The housing 14 is constructed on and attached to the planar surface 22 of the heatsink 12 whereby the tiered aperture means 24 of the housing forms a tiered cavity 26 on the planar surface 22 of the heatsink 12.

The housing 14 is formed from a first layer of dielectric glass ceramic lamina 14a attached to the planar surface 22 of the heatsink 12, a plurality of alternating layers of conductive circuit layers patterned to form a plurality of signal transmission lines 14b, d, f, and h and dielectric glass ceramic lamina 14c, e, and g and a last layer of dielectric glass ceramic lamina 14i.

The plurality of conductive circuit layers 14b, d, f, and h comprise at least one power layer 14b, at least one ground layer 14h and at least one signal layer 14d and f. The circuit layers, 14 b, d, f, and h are insulated from each other by the layers of dielectric lamina 14c, e, and g which are alternated between the circuit layers. The circuit layers 14 b, d, f, and h are connected to each other through a predetermined system of vias 28 which are punched in the plurality of layers of dielectric lamina 14 c, e, g, and i. The via 28 are tiny apertures formed perpendicular to the plane of the lamina 14 c, e, g, and i and are filled with conductive metal. The metal filling serves to interconnect the circuit layers 14 b, d, f, and h in a three dimensional system.

The plurality of lamina 14a, c, e, g, and i further have punched therein a central aperture 30 which, when all the lamina 14a, c, e, g, and i are layered together, form the tiered aperture 24 of the multilayer housing 14. The different layers of lamina 14a, c, e, g, and i have different size apertures punched therein. The apertures 30 of the lamina 14a, c, e, g, and i are configured, dimensioned and arranged so as to create the tiers 24a and b of the aperture 24 of the housing 14. The tier 24a serves to expose selected ends of the signal transmission lines 14d layered between the lamina 14c and 14 e. The tier 24b serves to create a shelf to attach a cover plate 20 over the tiered aperture 24.

The last layer of lamina 14i of the housing 14 has formed on its outer surface a plurality of metal contact pads 32 for the electrical interconnection of the package 10 to a printed wiring board (not shown). The metal contact pads 32 are also interconnected with circuit layers 14b, d, f, and h through preformed vias 28 (not shown) in the last layer of lamina 14i.

The semiconductor chip 16 is mounted on the planar surface 22 of the heatsink 12 within the tiered cavity 26 formed by the housing 14 attached to the planar surface 22. Attachment of the semiconductor chip 16 directly to the heatsink 12 creates an intimate thermal relationship between the heat generating source and the heat dissipating means. The heat generated by the semiconductor chip 16 is now conducted directly to the heatsink 12 where it can be convected away in a more efficient thermal conductive pathway.

The set of metal wirebonds 18 electrically interconnects the semiconductor chip 16 to the circuit layers 14b, d, f, and h of the housing 14 within the tiered cavity 26. One end of the wirebonds 18 is connected to the semiconductor chip 16 and the opposite end is connected to selected ends of the signal transmission line 14d exposed at the tier 26a of the cavity 26. Wirebonds are only one of several connection methods that can be utilized to connect the semiconductor chip to the circuit layer. One other known method is tab tape.

The cover plate 20 is mounted and sealed over the tiered cavity 26 completely enclosing the semiconductor chip 16 within the package 10.

The construction of the multilayer housing 14 on the heatsink surface 22 involves a sequential tape transfer process wherein the plurality of lamina 14a, c, e, and g are sequentially laminated onto the heatsink 12 and then fired under pressure to permanently bond the structure together. A general outline of the tape transfer process can be found in a patent issued to Hughes Aircraft Company, U.S. Pat. No. 4,645,552.

In order to obtain good bonding between the glass ceramic tape and the aluminum nitride the lamina must have a similar coefficient of thermal expansion to that of aluminum nitride. The match of TCE's prevents the silicon material from becoming detached from the aluminum nitride during heating.

Alternatively to obtain good bonding the lamina must be formed from a homogeneous mixture of approximately 70% glass and 30% aluminum nitride particles. The mixture of aluminum nitride particles with glass improves the wetability of aluminum nitride as a substrate for the attachment of thin glass lamina.

Again referring to FIGS. 2 and 3, in preparation for the tape transfer process the plurality of lamina 14a, c, e, g, and i are preformed to the desired dimension and have the required central apertures punched therein. The plurality of lamina 14a, c, e, g, and i also have punched therein the predetermined system of via 28 for the interconnection of the circuit layer 14b, d, f, and h.

To simplify the tape transfer process of alternating the layers of lamina 14a, c, e, g, and i and circuit 14b, d, f, and h, the circuit layers 14b, d, f, and h are screen printed onto pre-selected lamina 14a, c, e, and g. The via 28 are also filled with conductive metal to simplify the process.

The metalized lamina are then sequentially placed and laminated under pressure in a predetermined order onto the planar surface of the heatsink. (See FIG. 2 showing 2 layers of lamina 14a and 14g which have been screen printed with circuit layers 14b and 14h.) The sequential layering of the metalized lamina form the multilayer housing 14. As stated previously, the prepunched apertures 30 of the lamina 14a, c, e, g, and i are configured, dimensioned and arranged sequentially so as to create the tiers 24a and 24b of the aperture 24 of the housing 14.

The outermost layer of lamina 14i of the housing 14 has screen printed on its external surface, metal contact pads 32 for the electrical interconnection of the package 10 to a printed wiring board. The heatsink 12 and housing 14 are then fired under pressure (known as pressure assisted sintering) to permanently bond the two structures (heatsink to housing) and the individual lamina together. The pressure assisted sintering thereby forms a unitary package having a tiered cavity 26. The tiered cavity 26 formed has the planar surface 22 of the heatsink 12 as its base and tiered shelves 26a and 26b of widening dimensions as its sides.

The semiconductor chip 16 is attached directly to the planar surface 22 of the heatsink 12 within the center of the tiered cavity 26, and the wirebonds 18 connecting the semiconductor chip 16 to the system of circuit layers embedded within the housing 14 are attached from the chip 16 to the exposed ends of the signal transmission lines 14d at the tier 26a of the cavity 26. A cover plate 20 is then mounted and sealed over the cavity 26 to complete the package 10.

The procedure for forming the multilayer housing 14 is flexible and the steps can be be varied. The circuit layers 14b, d, f, and h need not be screen printed before lamination nor the vias 28 filled. Performing these tasks as preliminary steps simply consolidates the layering process.

An alternative method of forming the multilayer housing 14 without the application of pressure during sintering is to sinter the structure sequentially after the lamination of each lamina. This process does not require the addition of pressure to bond the layers together.

The integral heatsink semiconductor package 10 can take on many configurations for use in unlimited variations of chip design and integration. Such configurations include, but are not limited to, land grid arrays, pin grid arrays, and multichip packages.

In order to configure the integral heat sink package 10 for use in a land grid array package the injection molded heatsink 12 and the lamina 14a, c, e, g, and i are provided with means to attach the package through an interposer, to a printed wiring board. The usual means of attaching a land grid array semiconductor package to a printed wiring board is through the use of a set of nuts and bolts aligned through holes in the package and printed wiring board clamping the package to the printed wiring board with the interposer between the two.

Figure 4:
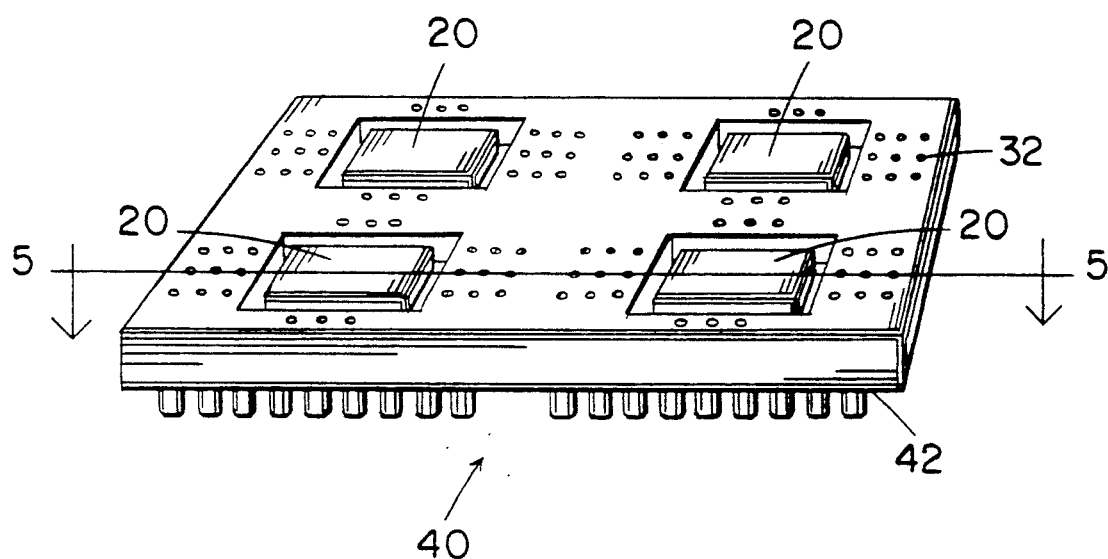
FIG. 4 is an inverted, isometric view showing a multiple semiconductor integral heatsink semiconductor package in accordance with the invention.
Figure 5:
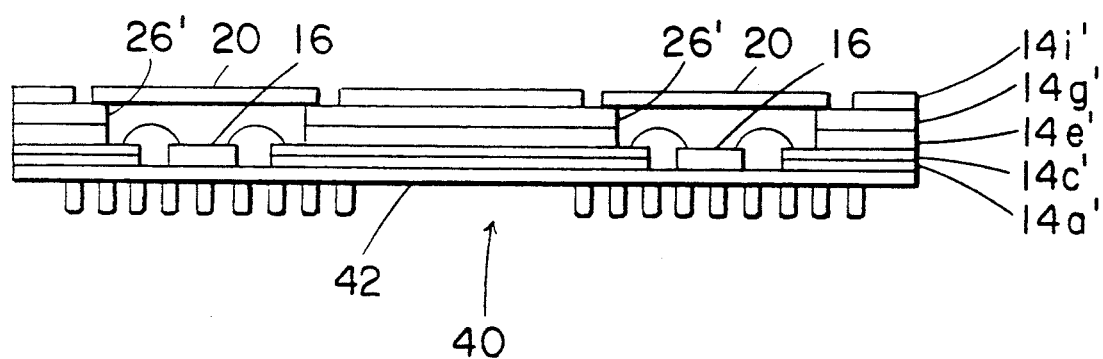
FIG. 5 is an inverted, cross sectional view cut along line 5—5 of FIG. 4 showing the internal configuration of a multiple semiconductor integral heatsink semiconductor package in accordance with the invention.

Referring now to FIGS. 4 and 5 there is shown an alternate embodiment of the integral heatsink semiconductor package incorporating the invention into a multichip package 40. Fabrication of this multichip package is accomplished by providing a larger injection molded heatsink 42 and lamina 14a', c', e', g', and i' having more than one central aperture so as to form a series of cavities 26' in a single structure. The cavities 26' are tiered and the package assembled as hereinabove described.

Figure 6:
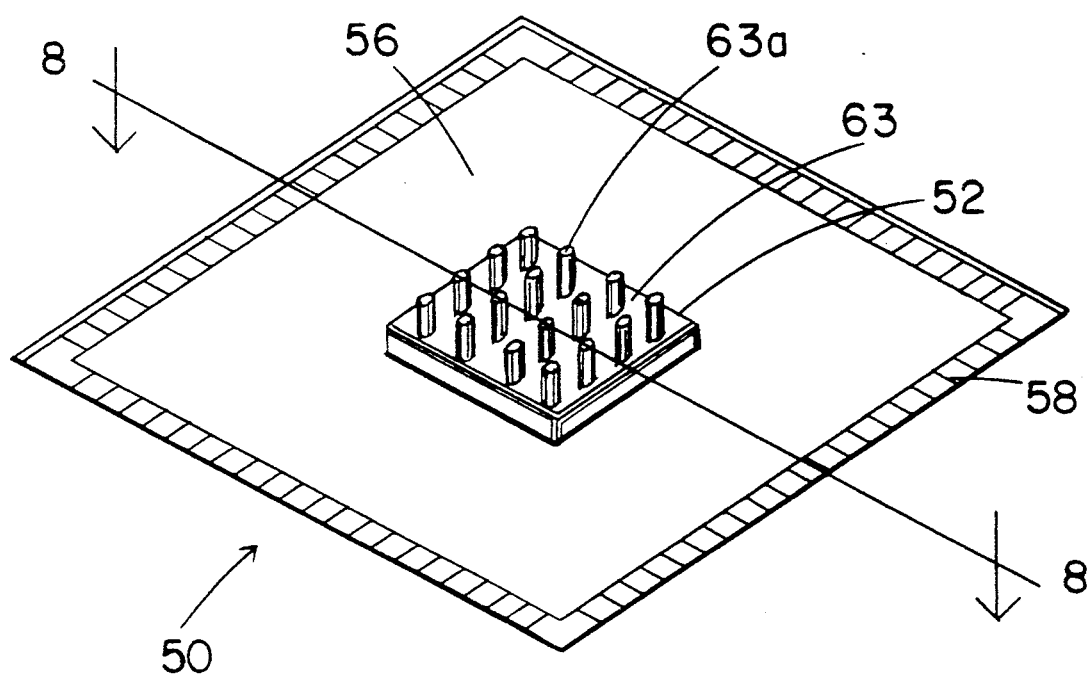
FIG. 6 is an isometric view showing a integral heatsink Tape Automated Bonding semiconductor package configuration in accordance with the invention.
Figure 7:
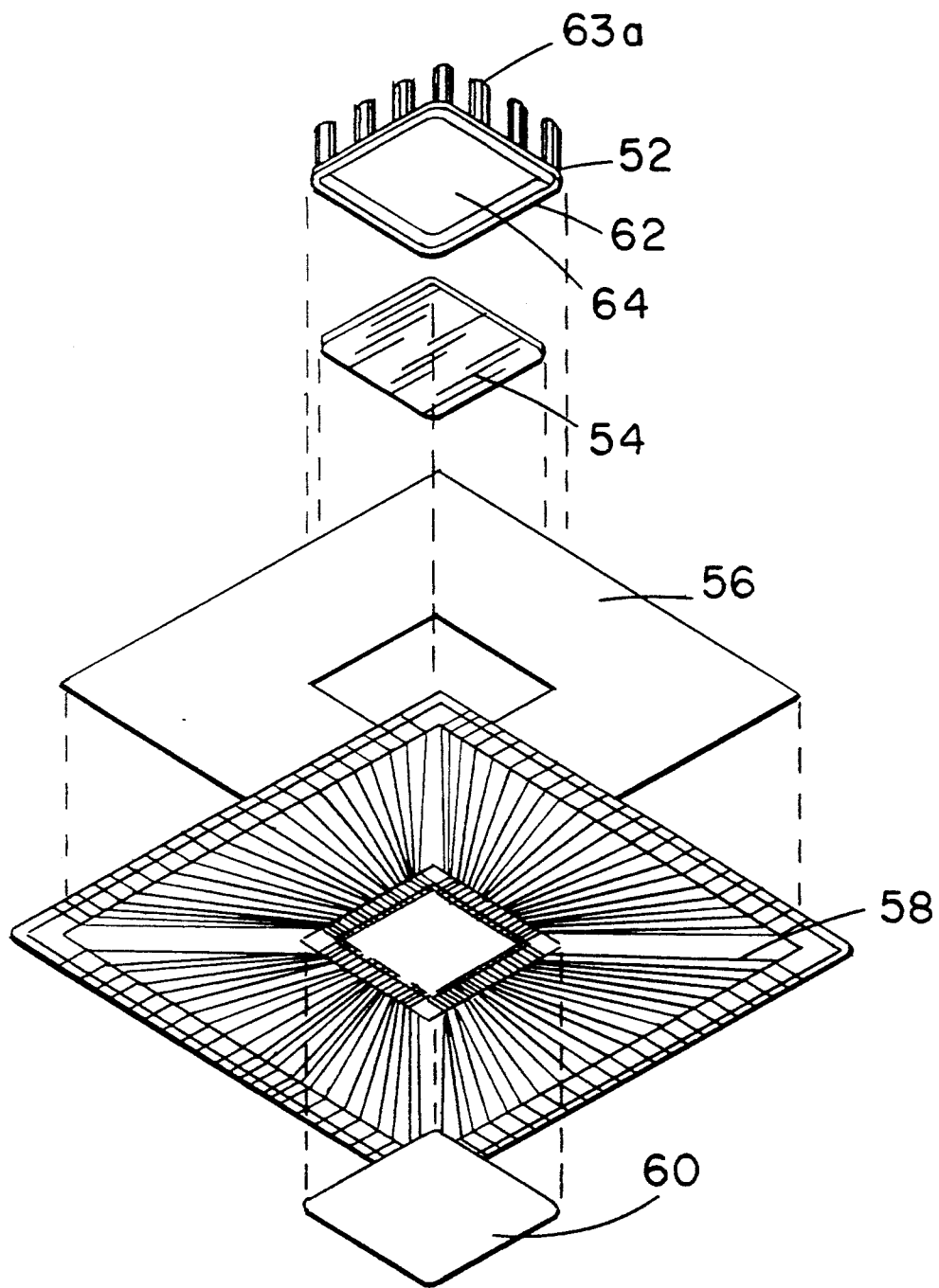
FIG. 7 is an exploded isometric view showing the individual components of an integral heatsink Tape Automated Bonding semiconductor package in accordance with the invention.
Figure 8:
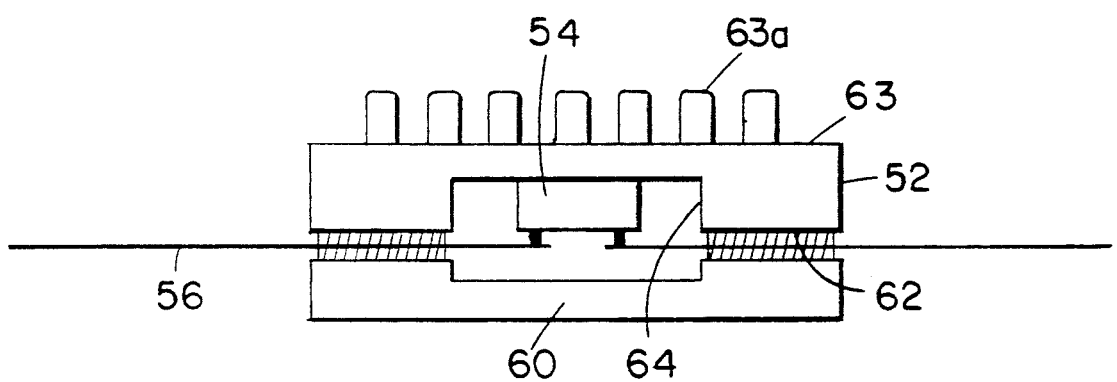
FIG. 8 is a cross sectional view cut along line 8—8 of FIG. 6 showing the internal configuration of an integral heatsink Tape Automated Bonding semiconductor package in accordance with the invention.

Referring now to FIGS. 6, 7, and 8 there is shown another preferred embodiment in the form of a Tape Automated Bonding Semiconductor Package 50 in accordance with the present invention. The subject matter of a Tape automated Bonding Semiconductor Package is found U.S. Pat. No. 4,914,741 of the same title issued Apr. 3, 1990 to Digital Equipment Corporation. There is shown an integral heatsink tape automated bonding semiconductor package 50 having an injection molded, aluminum nitride heatsink 52, a semiconductor chip 54, a section of tape automated bonding tape 56 having conductive leads 58 and a base plate 60.

The heatsink 52 is a generally rigid structure having a first planar surface 62 and an opposing surface 63 having heat dissipating means thereon 63a. The first surface 62 has a recessed cavity 64 with a planar surface formed therein.

The semiconductor chip 54 is mounted within the recessed cavity 64 of heatsink 52.

The section of tape automated bonding tape 56 has a plurality of conductive leads 58 connected to the semiconductor chip 54. The leads 58 extend outwardly therefrom and serve to connect the semiconductor chip 54 to a printed wiring board.

The base plate 60 is sealed over the conductive leads 58 and attached to the planar surface 63 thereby sealing the package 50 leaving only the conductive leads 58 of the section of tape automated bonding tape 56 exposed outside the package 50.

Accordingly the purpose of the present invention is to overcome existing packaging problems associated with power dissipation. The integration of a heatsink element into intimate heat transfer relation with a semiconductor package creates one piece, complete package in which the heatsink becomes part of the actual package and is no longer an external addition. The integration allows an intimate thermal relationship between the heat generating source of a semiconductor package and the heat dissipating means of the semiconductor package and creates the ability for superior heat transfer. The integration simplifies manufacturing by eliminating the need to attach an exterior heatsink after the package is fabricated and simultaneously allows for superior heat transfer capabilities by eliminating several thermal barriers to heat transfer. The integration design is cost efficient, space efficient, decreases the number of pieces and process steps during fabrication and creates the ability for superior power dissipation, better reliability, and simplification of manufacturing.

While there have been shown preferred embodiments, it is understood that various other adaptations and modifications may be made within the spirit and scope of the invention.

What is claimed is:

1. A method of fabricating an integral heatsink semiconductor package comprising the steps of:

providing an injection molded aluminum nitride heatsink having a first planar surface and a second opposing surface having heat dissipating means thereon;

providing a plurality of layers of conductive metal etchings comprising at least one ground layer, at least one power layer and at least one signal layer;

providing a plurality of dielectric lamina having at least one central aperture and a predetermined system of via formed therein, said plurality of lamina configured, dimensioned and arranged as to create at least one tiered cavity when laminated together;

laminating one of said plurality of dielectric lamina to said first planar surface of said heatsink;

filling said via of said lamina with conductive metal for the interconnection of said layers of said metal etching;

screen printing one of said plurality of layers of metal etching onto said laminated lamina;

repeating the steps of laminating, filling and screen printing until said process forms a multilayer housing on said first surface of said heatsink, said housing having at least one tiered cavity formed therein, said tiers exposing selected ends of said metal etching and forming a shelf for the attachment of a cover, said housing further having an external layer of lamina;

providing metal contact pads for the interconnection of said semiconductor package with a printed wiring board;

screen printing said contact pads on said external layer of lamina;

firing said structure under sufficient temperature and pressure to bond said heatsink and said lamina together;

providing at least one semiconductor chip;

attaching said at least one semiconductor chip to said first surface of said heatsink within said recessed cavity of said housing;

providing means for connecting said at least one semiconductor chip to said exposed ends of said metal etchings;

connecting said semiconductor to said exposed ends of said metal etchings using said connecting means;

providing at least one cover plate;

mounting said cover plate over said recessed cavity of said housing; and sealing said cover plate.

2. A method of fabricating an integral heatsink semiconductor package according to claim 1, wherein said means for connecting said at least one semiconductor chip to said exposed ends of said metal etchings is a set of wirebonds.

3. A method of fabricating an integral heatsink semiconductor package according to claim 1, wherein said means for connecting said at least one semiconductor chip to said exposed ends of said metal etchings is tab tape.

4. A method of fabricating an integral heatsink semiconductor package comprising the steps of:

providing an injection molded aluminum nitride heatsink having a first planar surface and a second opposing surface having heat dissipating means thereon;

providing a plurality of electrically conductive circuit layers patterned to form a plurality of signal transmission lines, said plurality of circuit layers comprising at least one ground layer, at least one power layer and at least one signal layer;

providing a plurality of dielectric lamina having at least one central aperture and a predetermined system of via formed therein, said plurality of lamina configured, dimensioned and arranged as to create at least one tiered cavity when laminated together;

laminating one of said plurality of dielectric lamina to said first planar surface of said heatsink;

filling said via of said lamina with conductive metal for the interconnection of said circuit layers;

screen printing one of said plurality of circuit layers onto said laminated lamina;

repeating the steps of laminating, filling and screen printing until said process forms a multilayer housing on said first surface of said heatsink, said housing having at least one tiered cavity formed therein, said tiers exposing selected ends of said signal transmission lines and forming a shelf for the attachment of a cover, said housing further having an external layer of lamina;

providing metal contact pads for the interconnection of said semiconductor package with a printed wiring board;

screen printing said contact pads on said external layer of lamina;

firing said structure under sufficient temperature and pressure to bond said heatsink and said lamina together;

providing at least one semiconductor chip;

attaching said at least one semiconductor chip to said first surface of said heatsink within said recessed cavity of said housing;

providing means for connecting said at least one semiconductor chip to said exposed ends of said signal transmission lines;

connecting said semiconductor to said exposed ends of said signal transmission lines using said connecting means;

providing at least one cover plate;

mounting said cover plate over said recessed cavity of said housing; and sealing said cover plate.

5. A method of fabricating an integral heatsink semiconductor package according to claim 4, wherein said means for connecting said at least one semiconductor chip to said exposed ends of said metal etchings is a set of wirebonds.

6. A method of fabricating an integral heatsink semiconductor package according to claim 4, wherein said means for connecting said at least one semiconductor chip to said exposed ends of said metal etchings is tab tape.

* * * * *